United States Patent
Yi et al.

(10) Patent No.: US 11,431,306 B2
(45) Date of Patent: Aug. 30, 2022

(54) COMPENSATION CIRCUIT FOR AMPLITUDE MODULATION-AMPLITUDE MODULATION OF RADIO FREQUENCY POWER AMPLIFIER

(71) Applicant: SMARTER MICROELECTRONICS (GUANG ZHOU) CO., LTD., Guangzhou (CN)

(72) Inventors: Jiangtao Yi, Guangzhou (CN); Qiang Su, Guangzhou (CN); Huadong Wen, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 149 days.

(21) Appl. No.: 17/120,167

(22) Filed: Dec. 12, 2020

(65) Prior Publication Data
US 2021/0099141 A1   Apr. 1, 2021

Related U.S. Application Data

(63) Continuation of application No. PCT/CN2019/127407, filed on Dec. 23, 2019.

(51) Int. Cl.
H03F 3/24 (2006.01)
H03F 3/195 (2006.01)
H03F 1/32 (2006.01)

(52) U.S. Cl.
CPC .......... *H03F 3/245* (2013.01); *H03F 1/3223* (2013.01); *H03F 3/195* (2013.01); *H03F 2200/451* (2013.01)

(58) Field of Classification Search
CPC ......... H03F 3/245; H03F 1/3223; H03F 3/195
See application file for complete search history.

(56) References Cited

U.S. PATENT DOCUMENTS

| | | | | |
|---|---|---|---|---|
| 2007/0024370 A1* | 2/2007 | Hirata | ...... | H03F 1/30 330/285 |
| 2009/0146740 A1* | 6/2009 | Lau | ...... | H03F 1/0261 330/296 |
| 2010/0066445 A1* | 3/2010 | Asano | ...... | H03F 3/245 330/149 |
| 2012/0108187 A1* | 5/2012 | Kitamura | ...... | H03F 1/32 455/110 |
| 2013/0257545 A1* | 10/2013 | Jeon | ...... | H03F 3/193 330/310 |
| 2015/0171796 A1* | 6/2015 | Matsui | ...... | H03F 3/211 330/296 |

* cited by examiner

*Primary Examiner* — Patricia T Nguyen
(74) *Attorney, Agent, or Firm* — Syncoda LLC; Feng Ma (57) ABSTRACT

An compensation circuit for an Amplitude Modulation-Amplitude Modulation (AM-AM) of a Radio Frequency (RF) power amplifier, including: a first biasing circuit, a power amplifier, and a compensation circuit located between the first biasing circuit and the power amplifier; herein, the compensation circuit includes a diode detection circuit and a feedforward amplifier for compensating AM-AM distortion.

20 Claims, 5 Drawing Sheets

COMPENSATION CIRCUIT FOR AMPLITUDE MODULATION-AMPLITUDE MODULATION OF RADIO FREQUENCY POWER AMPLIFIER

CROSS-REFERENCE TO RELATED APPLICATIONS

This application is a continuation of International Application No. PCT/CN2019/127407 filed on Dec. 23, 2019, which claims priority to Chinese Patent Application No. 201910915549.6, filed on Sep. 26, 2019. The disclosures of these applications are hereby incorporated by reference in their entirety.

BACKGROUND

In a mobile communication system, the efficiency and linear power of a front-end radio frequency (RF) power amplifier (referred to as a power amplifier) directly affect the energy consumption and communication quality of a base station and terminal device. The indexes of the output power and the Adjacent Channel Leakage Ratio (ACLR) of the uplink modulation signal of the terminal device after being amplified by the front-end RF power amplifier must meet the requirements of various mobile communication protocols.

SUMMARY

The disclosure relates to the field of electronic circuits, for example, to a compensation circuit for amplitude modulation-amplitude modulation (AM-AM) of a Radio Frequency (RF) power amplifier. The disclosure provides a compensation circuit for AM-AM of a RF power amplifier.

A compensation circuit for AM-AM of a RF power amplifier, including: a first biasing circuit, a power amplifier, and a compensation circuit located between the first biasing circuit and the power amplifier;

Herein the compensation circuit includes a diode detection circuit and a feedforward amplifier for compensating AM-AM distortion.

The diode detection circuit includes: a first transistor and a first resistor connected in parallel with the first transistor;

Herein a gate and a drain of the first transistor are shorted, and both the gate and the drain of the first transistor are connected to the first biasing circuit; a source of the first transistor is connected to a first end of the power amplifier, and the first end of the power amplifier is a gate of a second transistor in the power amplifier.

The feedforward amplifier includes: a first capacitor, a third transistor, and a second capacitor;

Herein, a first end of the first capacitor is connected to a RF input end, and a second end of the first capacitor is connected to a gate of the third transistor; a source of the third transistor is connected to ground, a drain of the third transistor is connected to a first end of the second capacitor, and a second end of the second capacitor is connected to a drain of the first transistor.

The feedforward amplifier further includes a second biasing circuit for providing a biasing current to the third transistor;

Herein the second biasing circuit is connected to the gate of the third transistor.

The feedforward amplifier further includes a voltage source and a second resistor connected in series with the voltage source;

Herein, the second resistor is connected to the drain of the third transistor for providing a biasing voltage to the drain of the third transistor.

The first resistor in the diode detection circuit is a variable resistor.

The amplification factor of the feedforward amplifier is an adjustable amplification factor.

At least one of the parameters of the third transistor in the feedforward amplifier; or, The parameters of the second biasing circuit in the feedforward amplifier are adjustable.

The parameters of the second biasing circuit are adjustable, at least including:

Current parameters of a first current source in the second biasing circuit are adjustable.

The compensation circuit further includes a circuit switch, and two ends of the circuit switch are connected in parallel with two ends of the first transistor.

The power amplifier includes one second transistor; or,

The power amplifier includes multiple second transistors, and the multiple second transistors form a stacked transistor structure therebetween.

In some embodiments, the compensation circuit for AM-AM of the RF power amplifier includes: a first biasing circuit, a power amplifier, and a compensation circuit located between the first biasing circuit and the power amplifier; herein, the compensation circuit includes a diode detection circuit and a feedforward amplifier for compensating AM-AM distortion. As such, the compensation circuit is introduced in front of the power amplifier, and it can be implemented by the diode detection circuit in the compensation circuit that in the case of the amplitude of the input signal of the power amplifier becoming larger, the gain compression due to the AM-AM distortion is compensated by increasing the biasing current (voltage) of the power amplifier. On the other hand, the feedforward amplifier in the compensation circuit can meet the requirements of the mobile communication protocols for the setup time of the power amplifier. In the embodiments of the disclosure, the compensation circuit for AM-AM of the RF power amplifier is relatively simple to be implemented and flexible in design. The programmable adjustment of the AM-AM can be implemented by adjusting the parameters in the compensation circuit, and it has good applicability, easy integration and low cost.

DETAILED DESCRIPTION

For the convenience of understanding the technical solutions of the embodiments of the disclosure, the related art of the embodiments of the disclosure is described below.

In a memory-free effect system, the ACLR performance of the power amplifier can be characterized by AM-AM distortion and Amplitude Modulation-Phase Modulation (AM-PM) distortion of the power amplifier. The greater the rate of variation of the AM-AM distortion and AM-PM distortion with variation of the input signal is, the worse the ACLR of the output signal of the power amplifier is. The source of the AM-AM distortion is mainly that the voltage input-current output characteristics of the transistor of the power amplifier exhibit nonlinear characteristics in the case of a signal with large amplitude being input. With the increase of the input drive power of the power amplifier, gain compression occurs in the power amplifier, leading to spectrum spreading and deterioration of the ACLR.

In the design of an amplifier, the difference value between a linear power (the power without distortion or with weak distortion) and a saturation power of a power amplifier is determined according to a Peak-to-Average Ratio (PAR) value (the ratio of the peak power with an occurrence probability of 0.01% to the total average power) of a non-constant envelope modulated signal used in a mobile communication system. The selection of the difference value requires a compromise between the ACLR performance and the efficiency of the power amplifier. When the value is selected too large, it is generally necessary to reduce the load impedance of the amplifier, the ACLR performance of the output signal is enough to meet the requirements of the protocols, but the power amplifier has a high operating current and low efficiency. When the value is selected too small, the load impedance of the power amplifier can be increased to reduce the current consumed by the power amplifier. However, the gain compression occurs too early, which will cause the distortion of some signals which are above the average power, and the ACLR performance cannot meet the requirements of the protocols.

There are many ways to reduce the effect of the gain compression of the power amplifier on the ACLR performance of the output signal while taking the efficiency into account, such as envelope tracking, digital compensation methods such as digital pre-distortion, etc. These methods have good effect, but require the cooperation of external chips, leading to a high cost and complex control. Another method is to add a compensation circuit for AM-AM in front of the power amplifier. In the case of the amplitude of the input signal of the power amplifier becoming larger, the gain compression due to the AM-AM distortion is compensated by increasing the biasing current (voltage) of the power amplifier. This method has a relatively simple circuit, good effect, easy integration and low cost.

Figure 1:
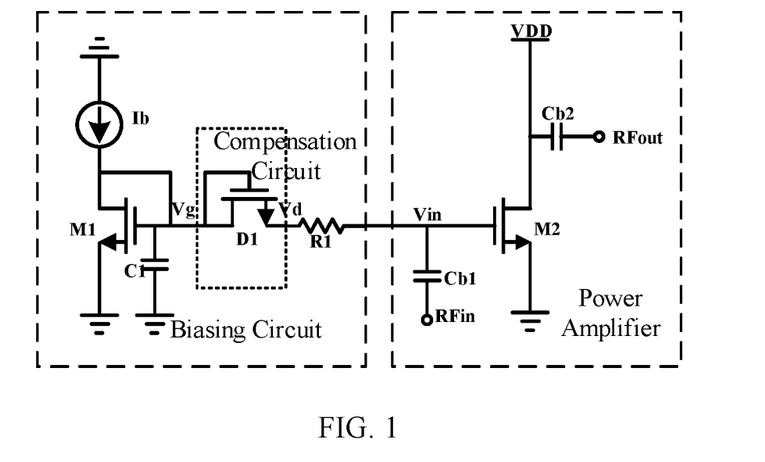
FIG. 1 is a schematic circuit diagram of a compensation circuit for AM-AM based on diode detection.

A compensation circuit based on diode detection is shown in FIG. 1, which adds a N-Metal-Oxide-Semiconductor (NMOS) transistor D1 into a biasing circuit formed of a NMOS transistor M1, a filter capacitor C1, an isolation resistor R1 and a current source Ib. The gate and the drain of the D1 are shorted for being used as a diode. To separate a node voltage Vg from Vd, and when a large signal is input, the detection effect of the D1 will have a raising effect on a voltage Vin to compensate the gain compression of the amplifier M2 under the large signal.

Figure 2:
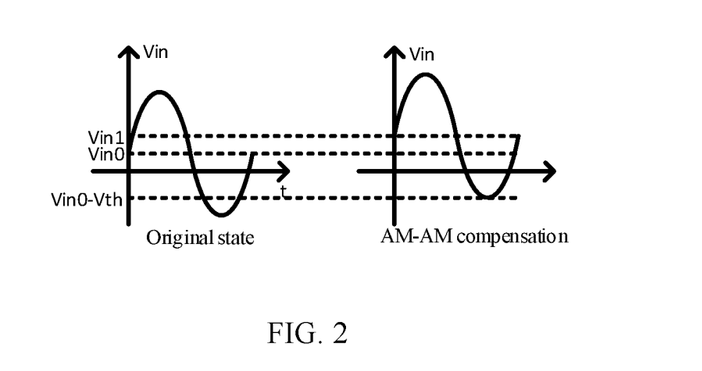
FIG. 2 is a schematic diagram of comparison between an original circuit and a compensation circuit for AM-AM.
Figure 3:
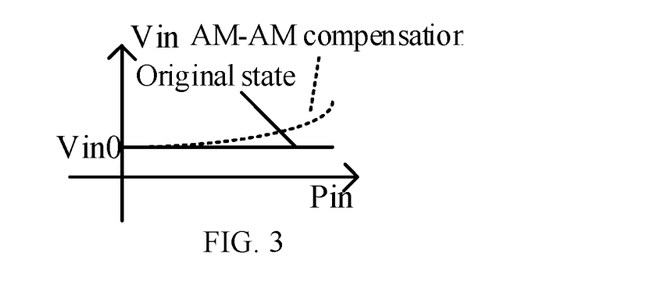
FIG. 3 is a schematic diagram of the variation of a Vin direct current level with an input power Pin, based on the compensation circuit for AM-AM shown in FIG. 1.
Figure 4:
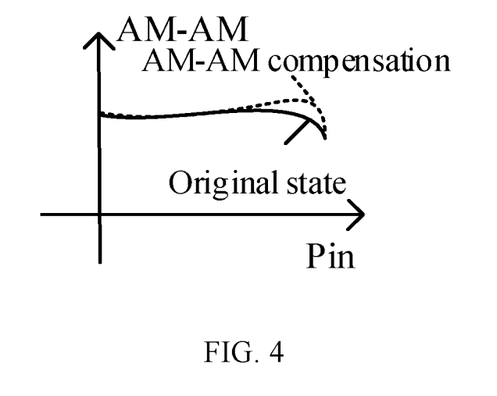
FIG. 4 is a schematic diagram of the compensation effect of gain compression based on the compensation circuit for AM-AM shown in FIG. 1.

The principle of the compensation circuit shown in FIG. 1 is as follows: under the condition of static current, due to the existence of leakage in the D1, and the time thereof is long enough, finally Vg=Vd=Vin=Vin0. When the power amplifier is operating, and when the swinging amplitude of the RF signal is negative, the reverse swinging amplitude of the Vin exceeds the threshold voltage Vth of the D1, the D1 is switched on and clamps the voltage of the Vin at Vin0-Vth so that the Vin cannot swing lower any more. When the swinging amplitude of the RF signal is positive, the positive swinging amplitude of the Vin is not limited by the D1. After stabilizing over several RF cycles, the positive swinging amplitude of the Vin is higher than the negative swinging amplitude of the Vin, as shown in FIG. 2. It can be known from the Fourier analysis that the DC component of the waveform of the Vin will be higher than the initial Vin, and the Vin voltage will be raised to Vin1. As shown in FIG. 3, when the power Pin of the input signal becomes larger, the swinging amplitude of the Vin voltage becomes larger, the detection effect of the diode D1 becomes more obvious, and the DC level of the Vin is raised higher, and the compensation effect of the gain compression is shown in FIG. 4.

There is a serious problem with the compensation circuit shown in FIG. 1, i.e., the setup time of the static current is too long. It can be known from the circuit analysis that the setup time of the Vin depends on the RC constant (a time constant of the time process of the transition response) of the node, herein the node resistance Rnet=(the cutoff equivalent resistance Requ of the D1+an isolation resistance R1), the cutoff equivalent resistance Requ of the D1 is usually very large, about $0.5*10^9$ ohm; the node capacitance Cnet1=(the equivalent capacitance Cgate of the gate of the power transistor M2+a filter capacitance C1) ≈4 pf, the time constant is about 2 ms; the setup time is about 8 ms estimated according to 4 times of the time constant. However, the mobile communication protocols require the setup time of the rising edge of the power amplifier ≤10 us, the circuit is far from meeting the protocol requirements and cannot be directly used in the RF power amplifier. To this end, the following technical solutions of the embodiments of the disclosure are proposed.

Figure 5:
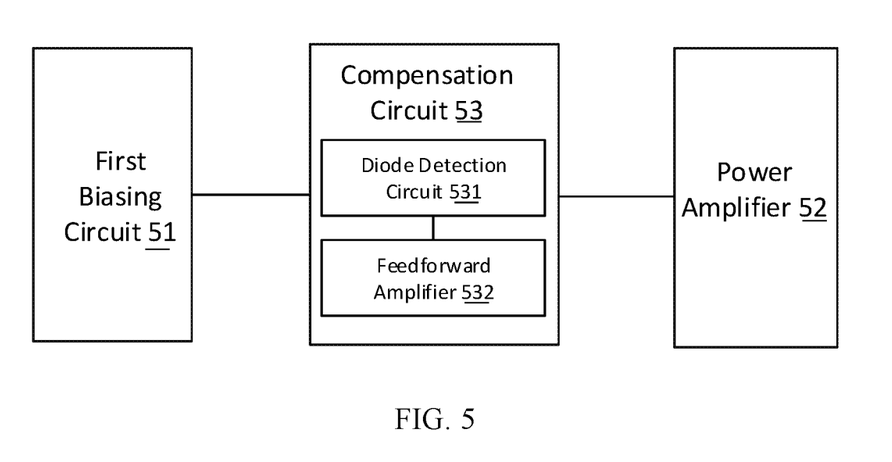
FIG. 5 is a schematic diagram of the composition structure of a compensation circuit for AM-AM of a RF power amplifier of an embodiment of the disclosure.

FIG. 5 is a schematic diagram of the composition structure of a compensation circuit for AM-AM of a RF power amplifier of an embodiment of the disclosure. As shown in FIG. 5, the compensation circuit for AM-AM of the RF power amplifier includes: a first biasing circuit 51, a power amplifier 52, and a compensation circuit 53 located between the first biasing circuit 51 and the power amplifier 52;

Herein, compensation circuit 53 includes a diode detection circuit 531 and a feedforward amplifier 532 for compensating AM-AM distortion.

In the technical solution of the embodiment, a compensation circuit including a diode detection circuit and a feedforward amplifier is provided between the first biasing circuit and the power amplifier, and can be implemented by the diode detection circuit in the compensation circuit that in the case of the amplitude of the input signal of the power amplifier becoming larger, the gain compression due to the AM-AM distortion is compensated by increasing the biasing current (voltage) of the power amplifier. However, the feedforward amplifier in the compensation circuit can still meet the requirements of the mobile communication protocols for the setup time of power amplifier.

It should be noted that in the embodiments of the disclosure, the compensation circuit may also be referred to as an AM-AM compensation circuit since it can compensate the gain compression due to the AM-AM distortion.

The compensation circuit for AM-AM of the RF power amplifier of the embodiments of the disclosure is illustrated below by way of examples in conjunction with specific circuit structures.

Figure 6:
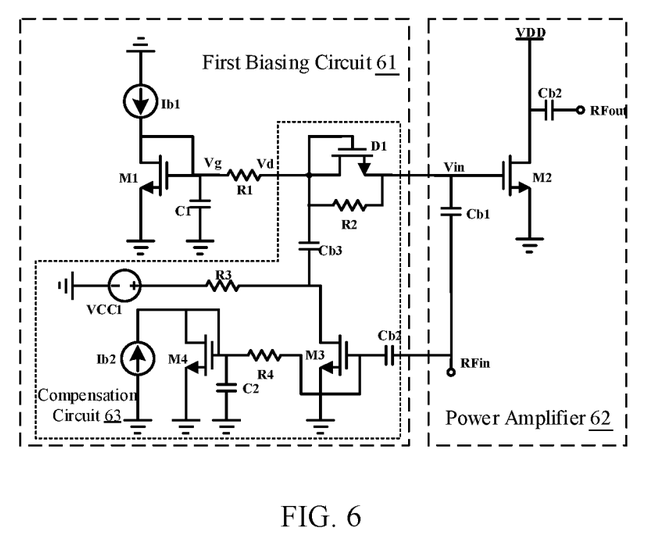
FIG. 6 is a first schematic circuit diagram of a compensation circuit for AM-AM of a RF power amplifier of an embodiment of the disclosure.

FIG. 6 is a first schematic circuit diagram of a compensation circuit for AM-AM of a RF power amplifier of an embodiment of the disclosure. As shown in FIG. 6, the compensation circuit for AM-AM of the RF power amplifier includes: a first biasing circuit 61, a power amplifier 62, and a compensation circuit 63 located between the first biasing circuit 61 and the power amplifier 62;

Herein, compensation circuit 63 includes a diode detection circuit and a feedforward amplifier for compensating AM-AM distortion.

In an optional implementation, the diode detection circuit in the compensation circuit 63 includes: a first transistor D1 and a first resistor R2 connected in parallel with the first transistor D1; herein the gate and the drain of the first transistor D1 are shorted, and both the gate and the drain of the first transistor D1 are connected to the first biasing circuit 61; and the source of the first transistor D1 is connected to the first end of the power amplifier 62, and the first end of the power amplifier 62 is the gate of the second transistor M2 in the power amplifier 62.

In an optional implementation, the feedforward amplifier in the compensation circuit 63 includes: a first capacitor Cb2, a third transistor M3, and a second capacitor Cb3; herein the first end of the first capacitor Cb2 is connected to a RF input end RFin, and the second end of the first capacitor Cb2 is connected to the gate of the third transistor M3; and the source of the third transistor M3 is connected to ground, the drain of the third transistor M3 is connected to the first end of the second capacitor Cb3, and the second end of the second capacitor Cb3 is connected to the drain of the first transistor D1.

In an optional implementation, the feedforward amplifier in the compensation circuit 63 further includes a second biasing circuit for providing a biasing current to the third transistor M3; herein, the second biasing circuit is connected to the gate of the third transistor M3.

In an optional implementation, the feedforward amplifier 63 further includes a voltage source VCC1 and a second resistor R3 connected in series with the voltage source VCC1 for providing a bias voltage to the drain of the third transistor M3; herein, the second resistor R3 is connected to the drain of the third transistor M3.

In an optional implementation, the first biasing circuit includes a first current source Ib1, a fourth transistor M1, a third capacitor C1, and a third resistor R1.

In an optional implementation, the second biasing circuit includes a second current source Ib2, a fifth transistor M4, a fourth capacitor C2, and a fourth resistor R4.

In an optional implementation, the power amplifier includes a second transistor M2, a fifth capacitor Cb1, and a sixth capacitor Cb2.

Based on the above circuit structure, it can be known that the compensation circuit is composed of the following two parts:

The first part (the diode detection circuit): during a particular implementation, the diode detection circuit is formed by the NMOS transistor D1 (i.e., the first transistor D1) with the way of diode connection and the isolation resistor R2 (i.e., the first resistor R2) connected in parallel; herein the R2 can effectively reduce the equivalent direct current resistance of the D1, reduce the total resistance of nodes of the biasing circuit, and can significantly improve the setup time of the static current.

The second part (the feedforward amplifier): during a particular implementation, the feedforward amplifier is formed by the DC isolation capacitor Cb2 (i.e., the first capacitor Cb2), the NMOS amplification transistor M3 (i.e., the third transistor M3) and the feedforward capacitor Cb3 (i.e., the third transistor M3). The biasing current of the feedforward amplifier is provided by the second biasing circuit composed of the current source Ib2 (i.e., the second current source Ib2), the NMOS transistor M4 (i.e., the fifth transistor M4), the filter capacitor C2 (i.e., the fourth capacitor C2) and the RF isolation resistor R4 (i.e., the fourth resistor R4). The biasing voltage of the drain of the feedforward amplifier is provided by the voltage source VCC1 and the biasing resistor R3 (i.e., the second resistor R3). The feedforward amplifier can effectively enhance the detection effect of the D1 and effectively compensate the effect introduced by the isolation resistor R2.

The operating principle of the above compensation circuit for AM-AM of the RF power amplifier is as follows.

When the swinging amplitude of the RF voltage of the RF input end RFin is positive with the magnitude of Vp, a part of the RF voltage is fed into the gate of the M3 in the feedforward amplifier through the DC isolation capacitor Cb2, and the feedforward amplifier is a common source amplifier, the swinging amplitude of the RF voltage of the drain of the M3 will be reversed to be negative. After passing through the feedforward capacitor Cb3, the swinging amplitude of the RF voltage of the node Vd is still negative, and the swinging amplitude of the RF voltage Vin of the gate of the M2 is still positive. The voltage of the gate of the NMOS transistor D1 is lower than the voltage of the source by Vp, the value of the R1 (i.e., the third resistor R1) is generally taken 20 kohm, isolating the effect of the Vd RF signal on the Vg voltage. The value of isolation resistor R2 is generally taken about 5 kohm, which is far less than the equivalent resistance of the D1. The swinging amplitude of the Vin forward voltage will be affected by the discharge of the charges in the R2 and Cb3 path, and the upper limit of the swinging amplitude will be limited.

When the swinging amplitude of the RF voltage of the RF input end RFin is negative with the magnitude of Vp, a part of the RF voltage is fed into the gate of the M3 in the feedforward amplifier through the DC isolation capacitor Cb2, the swinging amplitude of the RF voltage of the drain of the M3 will be reversed to be positive. After passing through the feedforward capacitor Cb3, the winging amplitude of the RF voltage of the node Vd is positive, and the winging amplitude of the RF voltage Vin of the gate of the M2 is still negative. The voltage of the gate of the NMOS transistor D1 is higher than the voltage of the source by Vp, the D1 is switched on and clamps the Vin at (Vp+Vin0)−Vth, which is higher than Vin0-Vth of the existing circuit, raising the lower limit of the negative swinging amplitude. By selecting the appropriate circuit parameters, the improvement of the negative swinging amplitude of the Vin through the D1 by the feedforward amplifier is stronger than the limitation on the positive swinging amplitude of the Vin by the discharge of the charges of the R2, R1 and the biasing transistor M1 path, so as to achieve the purpose of raising the DC voltage of the gate of the amplification transistor M2, and serve to compensate the large signal gain. The setup time of the static current of the circuit depends on the time constant RC of the node.

Herein the resistance of the node Rnet2 is equal to the isolation resistance R1+R2=25 kohm; and The node capacitance Cnet2=C1+Cb3+Cb1+Cgate≈2 pF+2 pF+4 pF+2 pF=10 pF, the time constant is about 250 ns, and the setup time is about 1us estimated according to 4 times of the constant time, which meets the requirements of the protocols for the setup time of the power amplifier.

In the technical solutions of the embodiments of the disclosure, the compensation circuit including the diode detection circuit and the feedforward amplifier is provided between the first biasing circuit and the power amplifier, and it can be implemented by the diode detection circuit in the compensation circuit that in the case of the amplitude of the input signal of the power amplifier becoming larger, the gain compression due to the AM-AM distortion is compensated by increasing the biasing current (voltage) of the power amplifier. On the other hand, the feedforward amplifier in the compensation circuit can meet the requirements of the mobile communication protocols for the setup time of the power amplifier. In the embodiments of the disclosure, the compensation circuit for AM-AM of the RF power amplifier is relatively simple to be implemented and flexible in design. The programmable adjustment of the AM-AM can be implemented by adjusting the parameters in the compensation circuit, and it has good applicability, easy integration and low cost.

Figure 7:
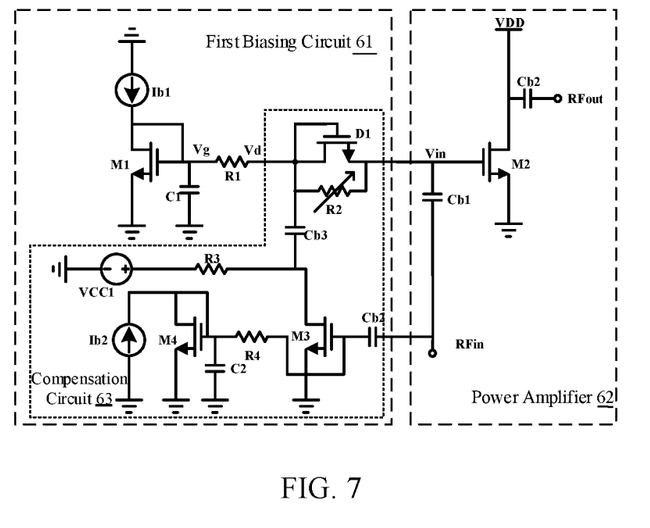
FIG. 7 is a second schematic circuit diagram of a compensation circuit for AM-AM of a RF power amplifier of an embodiment of the disclosure.

In one or more embodiments, in FIG. 6, the first resistor R2 in the diode detection circuit is a variable resistor, thus forming the circuit structure as shown in FIG. 7. The programmable controlling of the power point of activating the compensation for AM-AM and the compensation amplitude can be implemented by changing the resistance value of the R2, so as to achieve the purpose of increasing the applicability and flexibility of the circuit.

Figure 8:
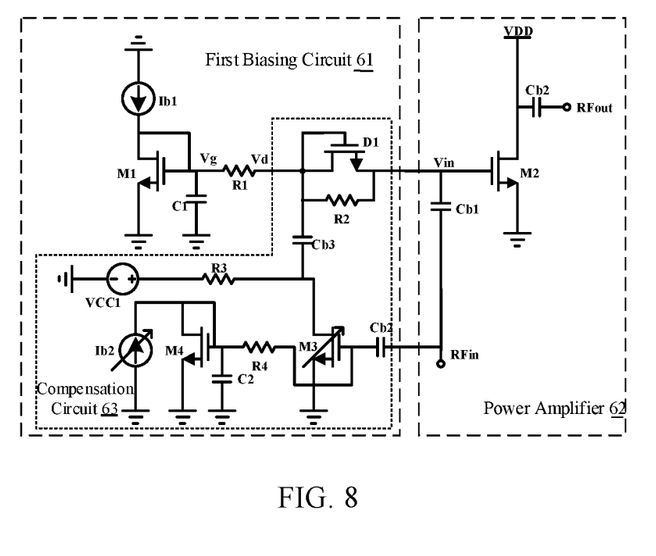
FIG. 8 is a third schematic circuit diagram of a compensation circuit for AM-AM of a RF power amplifier of an embodiment of the disclosure.

In one or more embodiments, in FIG. 6, the amplification factor of the feedforward amplifier in the compensation circuit for AM-AM of the RF power amplifier is an adjustable amplification factor, herein at least one of the parameters of the third transistor M3 in the feedforward amplifier; or the current parameters of the first current source Ib2 of the second biasing circuit in the feedforward amplifier are adjustable, thereby forming the circuit structure as shown in FIG. 8. The programmable controlling of the power point of activating the compensation for AM-AM and the compensation amplitude can be implemented by the method of changing the amplification factor of the feedforward amplifier.

Figure 9:
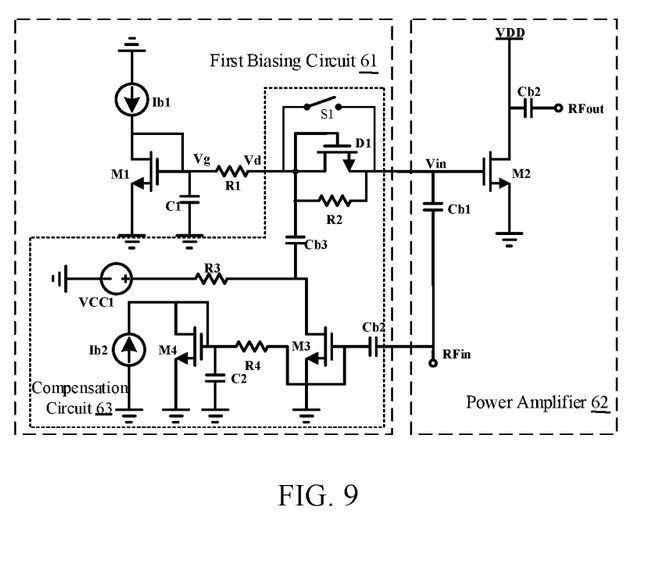
FIG. 9 is a fourth schematic circuit diagram of a compensation circuit for AM-AM of a RF power amplifier of an embodiment of the disclosure.

In one or more embodiments, in FIG. 6, the compensation circuit for AM-AM of the RF power amplifier further includes a circuit switch S1, the two ends of the circuit switch S1 are connected in parallel with two ends of the first transistor D1, thus forming the circuit structure as shown in FIG. 9. Whether the compensation circuit is activated, can be selected through the switch S1, when S1 is switched off, the compensation circuit works; and when S1 is switched on, the compensation circuit doesn't work.

Figure 10:
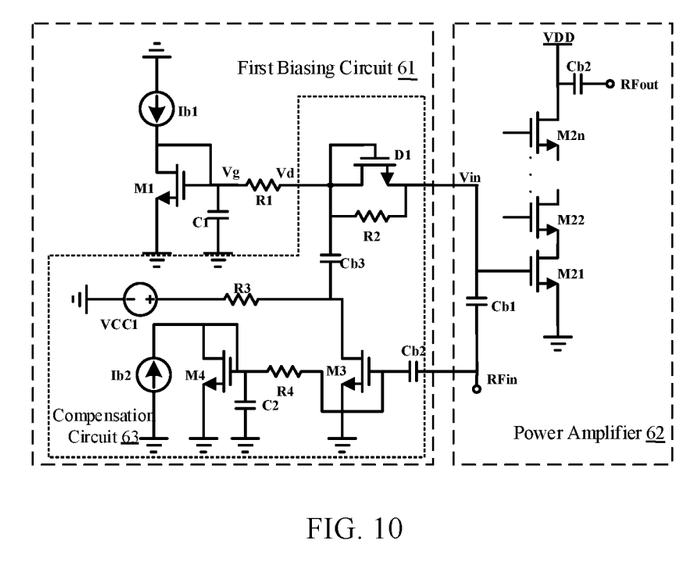
FIG. 10 is a fifth schematic circuit diagram of a compensation circuit for AM-AM of a RF power amplifier of an embodiment of the disclosure.

In one or more embodiments, in FIG. 6, the power amplifier of the compensation circuit for AM-AM of the RF power amplifier includes a second transistor M2; or extends the number of the second transistor M2, the power amplifier includes multiple second transistors M2, the multiple second transistors form a stacked transistor structure therebetween, thus forming the circuit structure as shown in FIG. 10, herein the number of the second transistor M2 is n, n is an integer equal to or greater than 2, FIG. 10 shows n M2 including M21, M22, . . . , M2n, and the n M2 form a stack transistor structure therebetween.

It should be noted that in the embodiments of the disclosure, the types of transistors are not limited to NMOS transistors only, but can also be other types of power transistors, such as Heterojunction Bipolar Transistors (HBTs) or Bipolar Junction Transistors (BJTs).

The terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A compensation circuit for Amplitude Modulation-Amplitude Modulation (AM-AM) of a Radio Frequency (RF) power amplifier, comprising: a first biasing circuit, a power amplifier, and a compensation circuit located between the first biasing circuit and the power amplifier;
   wherein the compensation circuit comprises a diode detection circuit and a feedforward amplifier for compensating AM-AM distortion.

2. The compensation circuit for AM-AM of the RF power amplifier of claim 1, wherein the diode detection circuit comprises: a first transistor and a first resistor connected in parallel with the first transistor; and
   wherein a gate and a drain of the first transistor are shorted, and both the gate and the drain of the first transistor are connected to the first biasing circuit; a source of the first transistor is connected to a first end of the power amplifier, and the first end of the power amplifier is a gate of a second transistor in the power amplifier.

3. The compensation circuit for AM-AM of the RF power amplifier of claim 1, wherein the feedforward amplifier comprises: a first capacitor, a third transistor, and a second capacitor; and
   wherein a first end of the first capacitor is connected to a RF input end, and a second end of the first capacitor is connected to a gate of the third transistor; a source of the third transistor is connected to ground, a drain of the third transistor is connected to a first end of the second capacitor, and a second end of the second capacitor is connected to a drain of the first transistor.

4. The compensation circuit for AM-AM of the RF power amplifier of claim 3, wherein the feedforward amplifier further comprises a second biasing circuit for providing a biasing current to the third transistor; and
   wherein the second biasing circuit is connected to the gate of the third transistor.

5. The compensation circuit for AM-AM of the RF power amplifier of claim 4, wherein the feedforward amplifier further comprises a voltage source and a second resistor connected in series with the voltage source for providing a biasing voltage to the drain of the third transistor; and
   wherein the second resistor is connected to the drain of the third transistor.

6. The compensation circuit for AM-AM of the RF power amplifier of claim 2, wherein the first resistor in the diode detection circuit is a variable resistor.

7. The compensation circuit for AM-AM of the RF power amplifier of claim 5, wherein the amplification factor of the feedforward amplifier is an adjustable amplification factor.

8. The compensation circuit for AM-AM of the RF power amplifier of claim 7, wherein
   at least one of the parameters of the third transistor in the feedforward amplifier; or,
   the parameters of the second biasing circuit in the feedforward amplifier are adjustable.

9. The compensation circuit for AM-AM of the RF power amplifier of claim 8, wherein the parameters of the second biasing circuit are adjustable, at least comprising:
   current parameters of a first current source in the second biasing circuit are adjustable.

10. The compensation circuit for AM-AM of the RF power amplifier of claim 2, wherein the compensation circuit further comprises a circuit switch, two ends of the circuit switch are connected in parallel with two ends of the first transistor.

11. The compensation circuit for AM-AM of the RF power amplifier of claim 10, wherein
    the power amplifier comprises one second transistor; or,
    the power amplifier comprises a plurality of second transistors, and the plurality of second transistors form a stacked transistor structure therebetween.

12. A communication device comprising the compensation circuit for AM-AM of the RF power amplifier of claim 1, wherein
    the compensation circuit is introduced in front of the power amplifier;
    in a case of that an amplitude of an input signal of the power amplifier becomes larger, gain compression due to AM-AM distortion is compensated by increasing a biasing current or voltage of the power amplifier;
    the feedforward amplifier is configured to meet requirements of mobile communication protocols for setup time of the power amplifier.

13. The communication device of claim 12, wherein the communication device is configured to realize programmable adjustment of the AM-AM by adjusting the parameters in compensation circuit.

14. The communication device of claim 13, wherein the diode detection circuit comprises: a first transistor and a first resistor connected in parallel with the first transistor; and
    wherein a gate and a drain of the first transistor are shorted, and both the gate and the drain of the first transistor are connected to the first biasing circuit; a source of the first transistor is connected to a first end of the power amplifier, and the first end of the power amplifier is a gate of a second transistor in the power amplifier.

15. The communication device of claim 12, wherein the feedforward amplifier comprises: a first capacitor, a third transistor, and a second capacitor; and
    wherein a first end of the first capacitor is connected to a RF input end, and a second end of the first capacitor is connected to a gate of the third transistor; a source of the third transistor is connected to ground, a drain of the third transistor is connected to a first end of the second capacitor, and a second end of the second capacitor is connected to a drain of the first transistor.

16. The communication device of claim 15, wherein the feedforward amplifier further comprises a second biasing circuit for providing a biasing current to the third transistor; and
    wherein the second biasing circuit is connected to the gate of the third transistor.

17. The communication device of claim 16, wherein the feedforward amplifier further comprises a voltage source and a second resistor connected in series with the voltage source for providing a biasing voltage to the drain of the third transistor; and wherein the second resistor is connected to the drain of the third transistor.

18. The communication device of claim 14, wherein the first resistor in the diode detection circuit is a variable resistor.

19. The communication device of claim 17, wherein the amplification factor of the feedforward amplifier is an adjustable amplification factor.

20. The communication device of claim 19, wherein
the parameters of the second biasing circuit are adjustable, at least comprising:
current parameters of a first current source in the second biasing circuit are adjustable;
the compensation circuit further comprises a circuit switch, two ends of the circuit switch are connected in parallel with two ends of the first transistor; and
the power amplifier comprises a plurality of second transistors, and the plurality of second transistors form a stacked transistor structure therebetween.

* * * * *